US008582102B2

(12) United States Patent
Guo et al.

(10) Patent No.: US 8,582,102 B2
(45) Date of Patent: Nov. 12, 2013

(54) TFT-LCD ARRAY SUBSTRATE, METHOD AND APPARATUS FOR DETECTING SIZE OR ALIGNMENT DEVIATION OF MULTILAYER PATTERNS

(75) Inventors: Jian Guo, Beijing (CN); Weifeng Zhou, Beijing (CN); Xing Ming, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 317 days.

(21) Appl. No.: 12/982,063

(22) Filed: Dec. 30, 2010

(65) Prior Publication Data

US 2011/0157587 A1   Jun. 30, 2011

(30) Foreign Application Priority Data

Dec. 31, 2009   (CN) .......................... 2009 1 0244615

(51) Int. Cl.
*G01B 11/00*   (2006.01)
(52) U.S. Cl.
USPC ..................... 356/401; 356/237.1; 356/237.6; 356/399
(58) Field of Classification Search
USPC ............................. 356/399–401, 237.1–237.6
See application file for complete search history.

(56) References Cited

U.S. PATENT DOCUMENTS

| 7,295,315 | B2 * | 11/2007 | Johnson | 356/401 |
| 7,336,352 | B2 * | 2/2008 | Tanaka | 356/306 |
| 2007/0229814 | A1 | 10/2007 | Yamaguchi | |
| 2008/0106738 | A1 * | 5/2008 | Kim | 356/399 |
| 2009/0033948 | A1 * | 2/2009 | Kondo | 356/616 |

FOREIGN PATENT DOCUMENTS

CN   101046625 A   10/2007

* cited by examiner

*Primary Examiner* — Tarifur Chowdhury
*Assistant Examiner* — Isiaka Akanbi
(74) *Attorney, Agent, or Firm* — Ladas & Parry LLP

(57) ABSTRACT

An embodiment provides a thin film transistor liquid crystal display (TFT-LCD) array substrate comprising a substrate and multilayer array patterns formed on the substrate, and a detecting mark, which is used to detect the size or alignment deviation of one array pattern among the multilayer array patterns and provided in a region of the substrate where the multilayer array patterns are not provided. The detecting mark comprises a detecting area and a detecting pattern which is provided in the same layer as the array pattern to be detected, the detecting pattern is located within the detecting area, and the detecting pattern has transmissivity or reflectivity different from that of the remaining area in the detecting area other than the detecting pattern.

18 Claims, 5 Drawing Sheets

TFT-LCD ARRAY SUBSTRATE, METHOD AND APPARATUS FOR DETECTING SIZE OR ALIGNMENT DEVIATION OF MULTILAYER PATTERNS

BACKGROUND

An embodiment of the invention relates to a thin film transistor liquid crystal display (TFT-LCD) array substrate, a method and an apparatus for detecting size or alignment deviation of multilayer patterns.

TFT-LCDs have been dominating the flat panel display market due to their advantages such as small volume, low power consumption and being free of radiation. A TFT-LCD is formed by assembling together an array substrate and a color filter substrate. On the array substrate, gate lines and data lines, which intersect with each other, are provided so as to define pixels, and a pixel electrode and a thin film transistor are provided in each pixel. By applying driving signals on gate lines, image data are applied to pixel electrodes in pixels via data lines. Orientation of liquid crystal molecules between the array substrate and the color filter substrate is controlled by voltage applied through the pixel electrodes so as to control the resultant intensity of the light passing therethrough, and then with the color filter substrate, an image can be presented on the panel of the TFT-LCD.

Currently, during the manufacturing process of a TFT-LCD, the sizes of the multilayer patterns formed on the TFT-LCD array substrate need to be detected so as to assure the uniformity of the process parameters and the stability of the product properties. The detecting may be conducted as follows. A microscope is moved to a certain area to be detected and a shot is taken with respect to the specified patterns in the area, and then the line width of the targeted pattern in the taken picture is obtained by using an image processing program. Generally speaking, the detecting process comprises the following steps: moving a glass substrate (the array substrate) to a detecting base station, aligning the glass substrate, positioning the detecting coordinate system, taking a picture of a certain area, conducting grey identification and measurement on the line width, and the like. With the above steps, the sizes of the patterns on the array substrate can be measured.

It is noted that the conventional detecting method for the TFT-LCD array substrate is time-consuming, and about 20 minutes to 30 minutes are taken to detect one array substrate due to the fussy detecting steps. Therefore, this results in lengthening of the whole production time and disadvantageously influences the production efficiency in the mass production.

SUMMARY

One embodiment provides a thin film transistor liquid crystal display (TFT-LCD) array substrate comprising a substrate and multilayer array patterns formed on the substrate, and a detecting mark, which is used to detect the size or alignment deviation of one array pattern among the multilayer array patterns and provided in a region of the substrate where the multilayer array patterns are not provided. The detecting mark comprises a detecting area and a detecting pattern which is provided in the same layer as the array pattern to be detected, the detecting pattern is located within the detecting area, and the detecting pattern has transmissivity or reflectivity different from that of the remaining area in the detecting area other than the detecting pattern.

Another embodiment provides a method for detecting size or alignment deviation of an array pattern or photoresist pattern during manufacturing a thin film transistor liquid crystal display (TFT-LCD) array substrate, comprising: providing a detecting mark in a region of the array substrate where no multilayer array patterns are provided, wherein the detecting mark is used to detect the size or the alignment deviation of the array pattern among the multilayer array patterns or the photoresist pattern, the detecting mark comprises a detecting area and a detecting pattern which is provided in the same layer as the array pattern to be detected, the detecting pattern is located within the detecting area, and the detecting pattern has transmissivity different from that of the remaining area in the detecting area other than the detecting pattern; irradiating the detecting mark from the backside of the substrate with direct light; receiving the light passing through the detecting mark; calculating the light transmissivity, and if the light transmissivity of the light is not consistent with a standard transmissivity, then the array pattern to be detected is determined as unqualified, otherwise the array pattern to be detected is determined to be qualified; or, wherein the detecting pattern has reflectivity different from that of the remaining area in the detecting area other than the detecting pattern, and irradiating the detecting mark from the front side of the substrate with direct light; receiving the light reflected back by the detecting mark; calculating the light reflectivity, and if the light reflectivity is not consistent with a standard reflectivity, then the pattern to be detected is determined as unqualified, otherwise the pattern to be detected is determined to be qualified.

Another embodiment provides an apparatus for performing the method mentioned above, comprising a light emitter and a light receiver wherein a detecting mark, which is used to detect size or alignment deviation of one array pattern among multilayer array patterns, is provided in a region of an array substrate where the multilayer array patterns are not provided, the detecting mark comprises a detecting area and a detecting pattern which is provided in the same layer as the array pattern to be detected, the detecting pattern is located within the detecting area, the detecting pattern has transmissivity or reflectivity different from that of the remaining area in the detecting area other than the detecting pattern; and wherein the light emitter is used to emit light to the detecting mark on the array substrate, and the light receiver is used to receive the light emitted from the light emitter and which passes through the detecting mark or is reflected back from the detecting mark.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

Some embodiments of the invention will be sufficiently described hereinafter with reference to the accompanying drawings. Obviously, the embodiments to be described are only a part but not all of the embodiments of the invention. All other embodiments obtained by those skilled in the art based on the described embodiments without inventive work should be included in the scope of the present invention.

An embodiment of the invention provides a TFT-LCD array substrate, a method and an apparatus for detecting size or alignment deviation of multilayer patterns, which can more quickly and accurately provide a measurement result and enhance the detecting efficiency and accuracy.

First Embodiment

Figure 1:
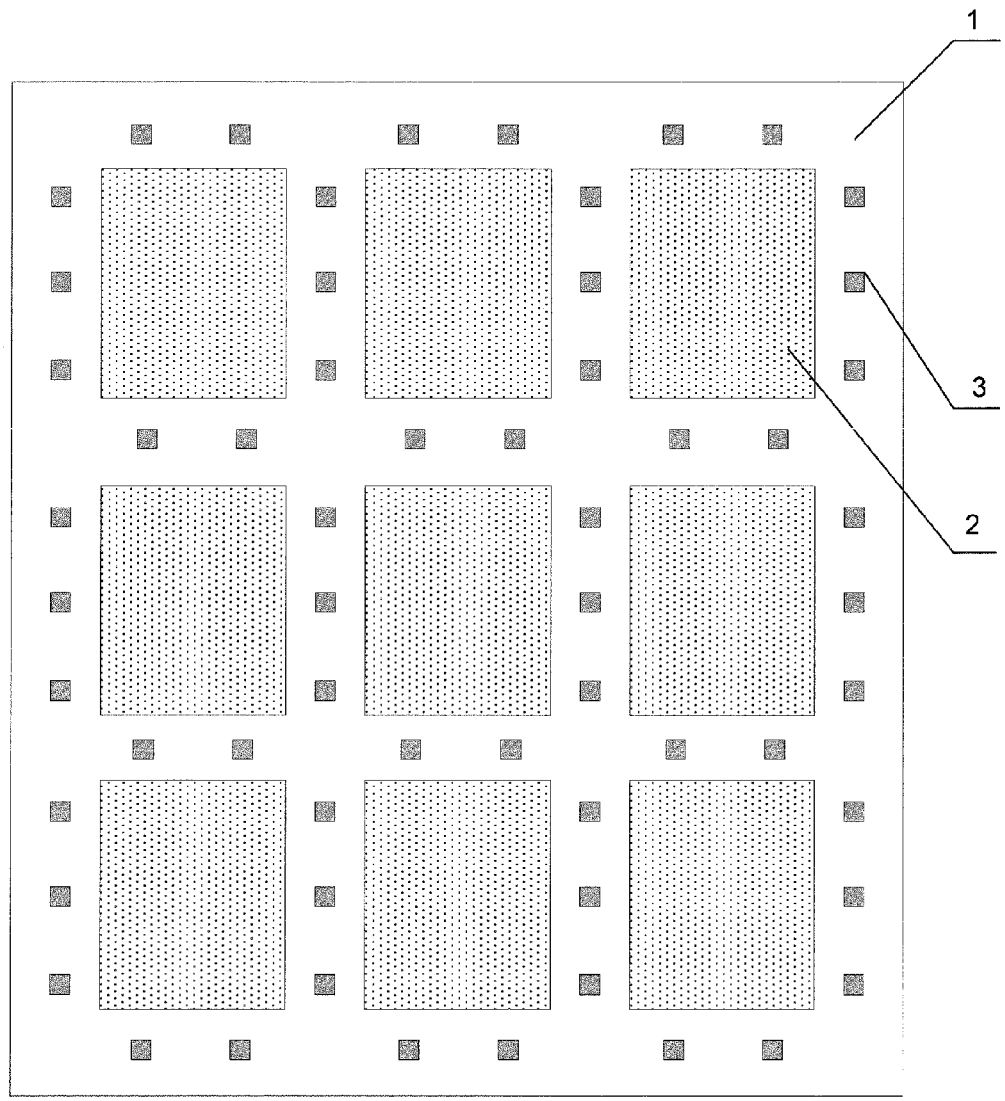
FIG. 1 is a structural schematic view of a TFT-LCD array substrate according to a first embodiment of the invention.

This embodiment provides a TFT-LCD array substrate, as shown in FIG. 1. The array substrate comprises a base substrate 1 and multilayer array patterns 2 formed on the substrate 1. Detecting marks 3 are provided in a region of the base substrate 1 where the multilayer array patterns 2 are not provided; as shown in FIG. 1, these marks 3 are formed in the peripheral region around the array region in which the multilayer array patterns 2 are formed. These marks 3 are used to detect the size of one array pattern among the multilayer array patterns 2. Each detecting mark 3 comprises a detecting area and a detecting pattern, and this detecting pattern is provided in the same layer and has the same size as the array pattern to be detected. The detecting pattern is located within the detecting area, and the detecting pattern has transmissivity or reflectivity different from that of the remaining area within the detecting area other than the detecting pattern. The term "provided in the same layer" throughout the specification means "forming simultaneously in the same process" but not limited to the same level. Thus, the size of the detecting pattern which is formed simultaneously with the pattern to be detected can be used to monitor the size of the pattern to be detected.

For conveniently detecting the size or alignment deviation of an array pattern in one layer (target pattern) on the TFT-LCD array substrate, the array substrate described above is provided in the embodiment. Specifically, the array substrate with a structure mentioned above is irradiated with direct light, and the line width of the array pattern (target pattern) in the layer is monitored in real time or on-line by detecting the variation in the light transmissivity or reflectivity of the whole detecting area.

The TFT-LCD array substrate and the color filter substrate are assembled together to form a motherboard, the motherboard may be further divided (or sliced) into more than one liquid crystal display modules. The detecting marks are disposed in a region where the multilayer array patterns are not provided, i.e., the non-pattern area. Therefore, the normal displaying function is not disadvantageously influenced while the detecting function can be performed on the TFT-LCD array substrate.

The multiplayer array patterns mentioned above may comprise patterns for gate lines, gate electrodes, data lines, common electrode lines, source electrodes, drain electrodes, TFT channels, or the like, and these patterns are formed in layers.

In the TFT-LCD array substrate provided in the embodiment, by providing detecting marks used to detect the size of the array pattern in one layer in the region where the multilayer array patters are not provided, and detecting the variation in the light transmissivity or reflectivity caused by the detecting patterns which are provided in the same layer and has the same size as the pattern to be detected (target pattern), the line width of the target pattern in the layer may be monitored in real time or on-line. The array substrate can be manufactured simply and easily, and the array substrate can be used to provide much quicker and more accurate detecting results and enhance the detecting efficiency and accuracy for the detecting on the array substrate.

Second Embodiment

During the production process of an array substrate, a plurality of different detecting marks may be formed for the array patterns in different layers so as to detect these array patterns in layers respectively.

Figure 2:
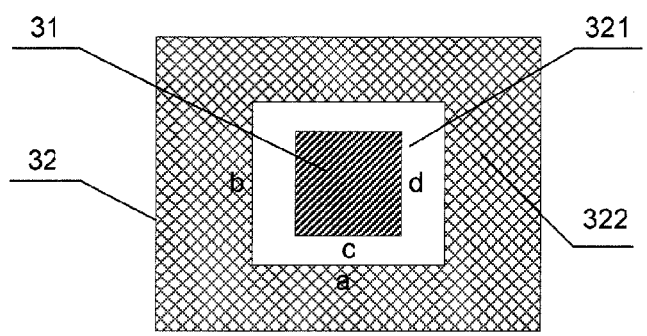
FIG. 2 is a structural schematic view of a detecting mark according to a second embodiment of the invention.

On the basis of the first embodiment, more specifically, the detecting mark may be a transmission type detecting mark. As shown in FIG. 2, a detecting base 32 comprises a transparent detecting window 321 formed in the central portion of the detecting base 32 and a nontransparent window frame 322.

In the embodiment, detection on the line width of data lines in a TFT-LCD array substrate is taken as an example. As shown in FIG. 2, in a region of the array substrate where the multilayer array patterns are not provided, a detecting pattern 31 is provided in the same layer and having the same size as the data lines to be detected, and a detecting base 32 which are not provided in the same layer as the detecting pattern is formed. The detecting base 32 comprises a transparent detecting window 321 in the central portion of the detecting base 32 and a nontransparent window frame 322. The detecting pattern 31 and the detecting base 32 are provided in a perpendicularly overlapping manner so that the detecting pattern 31 can be located at a central portion in the detecting window 321 when viewed from the above.

The detecting base 32 may be provided in the same layer as the patterns other than the data lines, or may be formed in an individual process so as to be provided in a different layer from the multilayer array patterns. In the embodiment, the detecting base 32 provided in the same layer as gate lines is taken as an example. In this case, before forming the rectangular detecting pattern 31, the detecting base 32 is formed at a position below the rectangular detecting pattern 31 to be formed later in the non-pattern area of the substrate, i.e., the detecting base 32 is formed in the same layer as the gate lines. The detecting base 32 comprises a nontransparent window frame 322 formed by the same material as that for forming the gate lines and a transparent detecting window 321 surrounded by the window frame 322 so that the detecting pattern 31 to be formed in an upper layer is located above the detecting window 321. In addition, the size of the detecting pattern 31 is slightly smaller than that of the detecting window 321 so as to be within the detecting window 321.

Figure 3:
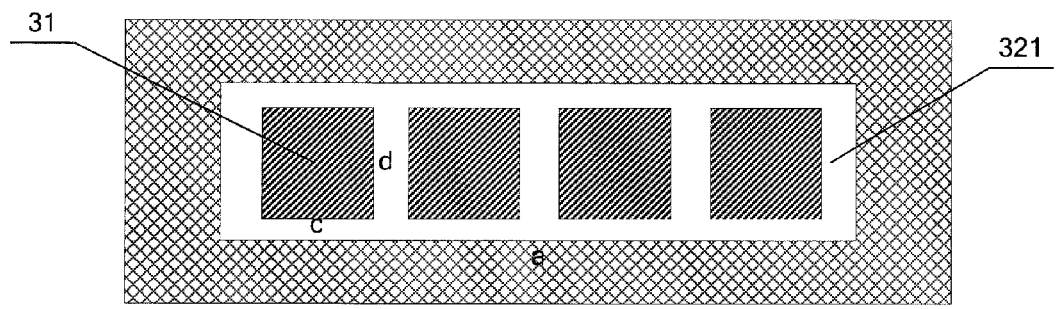
FIG. 3 is another structural schematic view of a detecting mark according to the second embodiment of the invention.

During detecting, the detecting mark is irradiated with direct light from the backside of the array substrate. The area of the detecting window 321 can be expressed as S=ab, where a and b are the length and width of the rectangular detecting window, respectively. Since the detecting window 321 is a standard window whose configuration is predetermined, the area S is a constant value. Therefore, the light transmissivity can be represented as 1−cd/S, where c and d are the length and width of the rectangular detecting pattern 31, respectively. Further, several (such as "n") detecting patterns 31 may be provided above the detecting window 321, as shown in FIG. 3, and "n" is the number of the detecting patterns 31 that are provided within the detecting window 321. In this case, the transmissivity for the light that are irradiated from the backside of the detecting area is represented as 1−ncd/S. During the exposing, developing and etching processes for manufacturing a TFT-LCD, the profiles of the patterns, which is in formation, contract or enlarge substantially at the same ratio. That is to say, when c is changed by 1 micron, d will also be changed by 1 micron. If both c and d are increased by 1 micron, then the transmissivity of the detecting mark (or detecting area) is 1−n(c+1)(d+1)/S, and the variation amount of the transmissivity is 1−n(c+1)(d+1)/S−(1−ncd/S)=−n(c+d+1)S. For example, if S=400, n=4, c=d=6 micron, then the transmissivity is changed by 13%. When the line width is changed by 2 microns, the transmissivity is changed by 78%.

As described above, the detecting mark in the array substrate according to the embodiment may comprise a transparent detecting area and a nontransparent detecting pattern within the detecting area. In the embodiment, the transparent detecting area corresponds to the detecting window 321 surrounded by the window frame 322.

As described above, the size of the detecting pattern influences the light transmissivity of the detecting area directly. The variation of the size of the detecting pattern can be obtained by monitoring the transmissivity, and the size variation of the target array pattern in the pattern area can be further obtained.

For the TFT-LCD array substrate provided in the embodiment, the detecting mark used to detect the size of the array pattern in one layer is provided in a region where the multilayer array patterns are not provided. In the manufacturing process, the detecting mark is irradiated with direct light, and the line width of the array pattern in the layer can be monitored in real time or on-line by detecting the variation in the light transmissivity caused by the detecting pattern which is provided in the same layer and has the same size as the array pattern to be detected. The array substrate can be manufactured simply and is easy to be realized; with the detecting mark, the detecting process can provide quick and accurate detecting result and enhance the detecting efficiency and accuracy for the detection on the array substrate.

Third Embodiment

Figure 4:
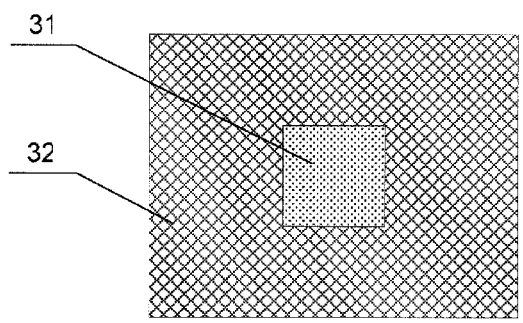
FIG. 4 is a structural schematic view of a detecting mark according to a third embodiment of the invention.

On the basis of the first embodiment, the detecting mark may be a reflection type detecting mark, as shown in FIG. 4, i.e., the detecting pattern 31 is non-reflective and the detecting base 32 is reflective.

The detecting base 32 may be provided in the same layers as the patterns other than the pattern to be detected, or may be formed in an individual process so as to be provided in a layer different from the multilayer array patterns. In the embodiment, a detecting base 32 provided in the same layer as the gate lines is taken as an example. A non-reflective detecting pattern 31 is provided in the same layer and has the same size as the array pattern to be detected. Before the formation of the detecting pattern 31, a detecting base 32 is formed at a position below the detecting pattern 31 to be formed in the non-pattern area of the array substrate, that is to say, the detecting base 32 is provided in the same layer as the gate lines.

During detecting, the detecting mark is irradiated perpendicularly from the front side of the array substrate with direct light, and the variation in the size of the detecting pattern (detecting area) is obtained by monitoring the reflectivity, and the size of the target array pattern in the pattern area can be further obtained.

It can be shown from the third embodiment that the variation in the size of the target pattern may be determined by monitoring the reflectivity of the detecting area. In this case, it is necessary that the reflectivity of the detecting pattern and the reflectivity of the remaining area in the detecting area other than the detecting pattern are different. In the embodiment, the reflective detecting base 32 defines the detecting area, and the pattern 31 over the detecting base 32 forms the detecting pattern within the detecting area.

For the TFT-LCD array substrate provided in the embodiment, the detecting mark used to detect the size of the array pattern in one layer are provided in a region where the multilayer array patterns are not provided. In the manufacturing process, the detecting mark is irradiated with direct light, and the line width of the array pattern in the layer may be monitored in real time or on-line by detecting the variation in the light reflectivity caused by the detecting pattern which is provided in the same layer and has the same size as the pattern to be detected. The array substrate can be manufactured simply and is easy to be realized; with the detecting marks, the detecting process can provide quick and accurate detecting result and enhance the detecting efficiency and accuracy for the detection on the array substrate.

Fourth Embodiment

This embodiment provides a method to detect the size of an array pattern or a photoresist pattern during manufacturing the TFT-LCD array substrate. The method comprises the following steps.

Step S11, forming a detecting mark used to detect the size of an array pattern among the multilayer array patterns in a region of the array substrate where the multilayer patterns are not provided. The detecting mark comprises a detecting area and a detecting pattern which is provided in the same layer and has the same size as the array pattern to be detected. The detecting pattern is located within the detecting area, and the detecting pattern has transmissivity different from that of the remaining area in the detecting area other than the detecting pattern.

Step S12, irradiating the detecting mark from the back side of the substrate with direct light.

Step S13, receiving the light passing through the detecting mark.

Step S14, calculating the light transmissivity. If the light transmissivity is not consistent with a standard transmissivity, then the pattern to be detected is not qualified, otherwise the pattern to be detected is qualified.

Figure 5:
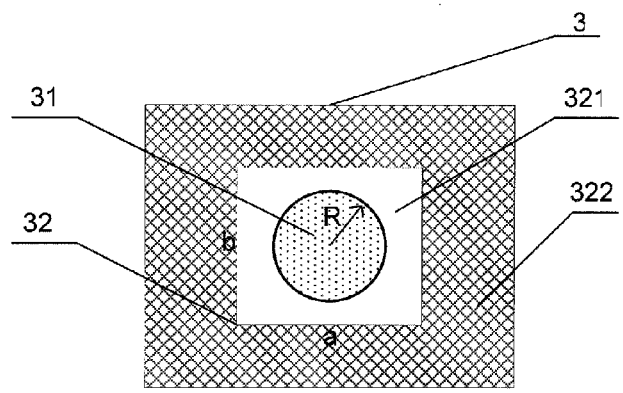
FIG. 5 is a structural schematic view of a detecting mark according to a fourth embodiment of the invention.

Furthermore, as shown in FIG. 5, the detecting mark can be a transmission type detecting mark. The detecting base 32 comprises a transparent detecting window 321 in the central portion of the detecting base 32 and a nontransparent window frame 322. The transparent detecting window 321 surrounded by the nontransparent window frame 322 defines the detecting area, and the nontransparent detecting pattern 31 is located within the detecting area.

An example in which the size of the photoresist pattern used to form a through hole is detected during manufacturing the TFT-LCD is described.

FIG. 5 shows the detecting mask to be used when it is necessary to detect the size of a photoresist pattern used to form a through hole. Firstly, a circular pattern is formed on the mask plate used in the exposure process for forming the through hole, and the circular pattern is not transparent and has a size consistent with that of the through hole. That is to say, in the pattern area of the mask plate, a non-transparent metal layer is deposited, and a transparent circular pattern is formed in this metal layer. However, in the detecting pattern area of the mask plate, a non-transparent metal pattern with the size as the above circular patters is formed. Thus, when the array substrate is manufactured, the pattern area of the mask plate is used to form the photoresist pattern for forming the through hole on the array substrate, and the formed pattern is a transparent circular hole pattern. With the non-pattern area of the mask plate, a detecting pattern 31 that is nontransparent is formed on the array substrate, and the detecting pattern 31 has same size as that of the circular hole in the photoresist pattern used for forming the through hole on the array substrate.

Before the circular detecting pattern 31 is formed, a detecting base 32 may be formed at a certain position below the detecting pattern 31 to be formed on the array substrate while forming the layer of gate line pattern, i.e., the detecting base 32 is provided in the same layer as the gate lines. The detecting base 32 comprises a nontransparent window frame 322 formed of the same material as that of forming the gate lines and a transparent detecting window 321 surrounded by the window frame 322, with the detecting pattern 31 being located above the detecting window 321. Furthermore, the size of the detecting pattern 31 should be slightly smaller than that of the detecting window 321 so as to be within the detected window 321.

Figure 6:
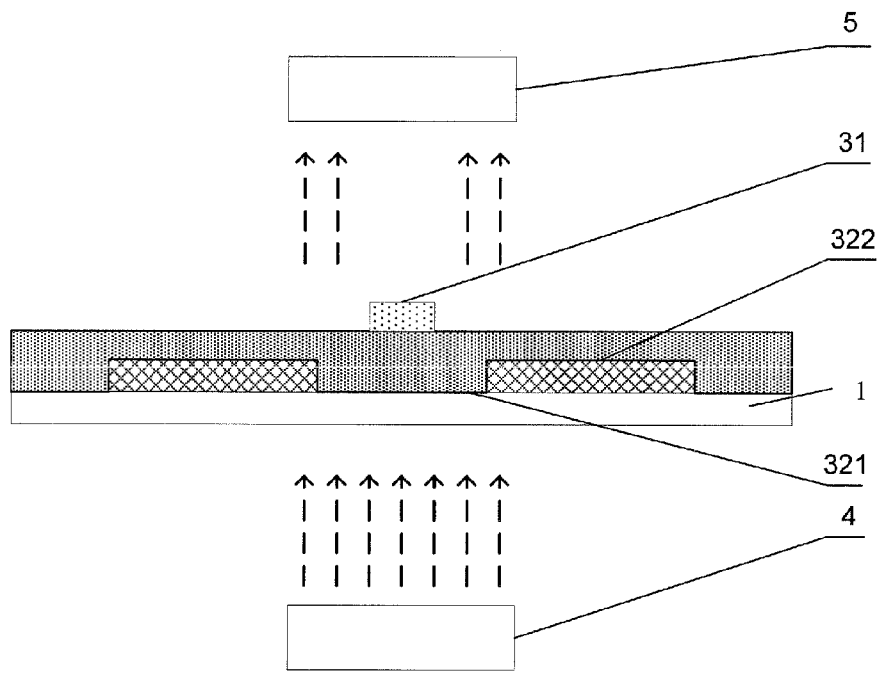
FIG. 6 is a schematic view showing a detecting method according to the fourth embodiment of the invention.

During detecting, as shown in FIG. 6, the detecting mark 3 on the array substrate 1 is irradiated from the backside of the array substrate 1 with direct light by using a light emitter 4. A part of light emitted from the light emitter 4 is blocked by the circular detecting pattern 31, the other part of light passes through the detecting window 321 and is received by a light receiver 5. The size of the circular detecting pattern 31 is obtained according to the nontransparent area calculated from the received light, and the size of the photoresist pattern for forming the through hole is further obtained. Thus, whether the size of the through hole after exposing and developing processes meets the standard can be determined.

Figure 7:
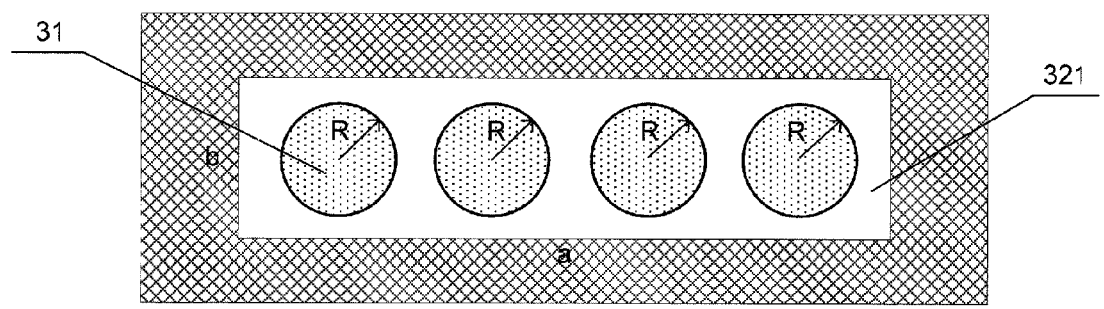
FIG. 7 is another schematic view of a detecting mark according to the fourth embodiment of the invention.

Specifically, as shown in FIG. 5, if the radius of the circular detecting pattern 31 is R, the transmissivity of the light irradiated from the backside in the detecting area can be expressed as $1-\pi R^2/S$, where S is the area of the detecting window 321, and S=ab. The detecting window 321 is a predetermined standard window with a constant area of S. When the detecting pattern 31 meets the standard, and the radius R is equal to the radius of the through hole to be detected, the transmissivity $1-\pi R^2/S$ does not change. If the radius R of the detecting pattern 31 is changed, then the transmissivity $1-\pi R^2/S$ changes accordingly, thus the size of the through hole is determined as unqualified. Several (such as "n") detecting patterns 31 may be provided above the detecting window 321, as shown in FIG. 7, where n is the number of the detecting pattern 31 in the detecting window 321. The total area of the detecting patterns 31 is $n\pi R^2$, and the transmissivity of the light irradiated from the backside in the detecting area can be expressed as $1-n\pi R^2/S$. When the radius R of the pattern increases by 1 micron, the transmissivity of the detecting mark (i.e., the detecting area) is $1-n\pi(R+1)^2/S$, and the variation amount of the light transmissivity is $n\pi(2R+1)/S$. Given R=5 microns and n=4, the area of the detecting window is 40 microns×40 microns, and when the radius R varies by 1 micron, the transmissivity changes by 34.54%. The value of R can be obtained on the basis of the light transmissivity by the detection of the light receiver which is disposed at the front side of the substrate.

In the embodiment, similar to the embodiment shown in FIG. 2, the size of the target array pattern is detected by monitoring the variation in the light transmissivity. Different from the second embodiment, the detecting pattern in the embodiment is of a circular shape. The shape of the detecting pattern is not limited to a circular shape nor a square shape. However, it is preferable that the detecting pattern is of a regular shape for convenience of the calculation of the size.

For the TFT-LCD array substrate provided in the embodiment, the detecting mark used to detect the size of the array pattern in one layer is provided in a region where the multilayer array patterns are not provided. In the manufacturing process, the detecting mark is irradiated with direct light, and the line width of the target array pattern in the layer can be monitored in real time or on-line by detecting variation in the light transmissivity caused by the detecting pattern which is provided in the same layer and has the same size as the pattern to be detected. The method is easy to be performed and provides much quick and accurate detecting result for real time size detecting on the array pattern in the detected layer during manufacturing the array substrate and enhances the detecting efficiency and accuracy.

Fifth Embodiment

This embodiment provides a method to detect the size of an array pattern or a photoresist pattern during manufacturing the TFT-LCD array substrate. The method comprises the following steps.

Step S21, forming a detecting mark used to detect the size of an array pattern among the multilayer array patterns in a region of the array substrate where the multilayer patterns are not provided. The detecting mark comprises a detecting area and a detecting pattern which is provided in the same layer and has the same size as the pattern to be detected. The detecting pattern is located within the detecting area, and the detecting pattern has reflectivity different from that of the remaining area in the detecting area other than the detecting pattern.

Step S22, irradiating the detecting mark from the front side of the substrate with direct light.

Step S23, receiving the light reflected from the detecting mark.

Step S24, calculating the light reflectivity. If the light reflectivity is not consistent with a standard reflectivity, then the pattern to be detected is not qualified, otherwise the pattern to be detected is qualified.

Figure 8:
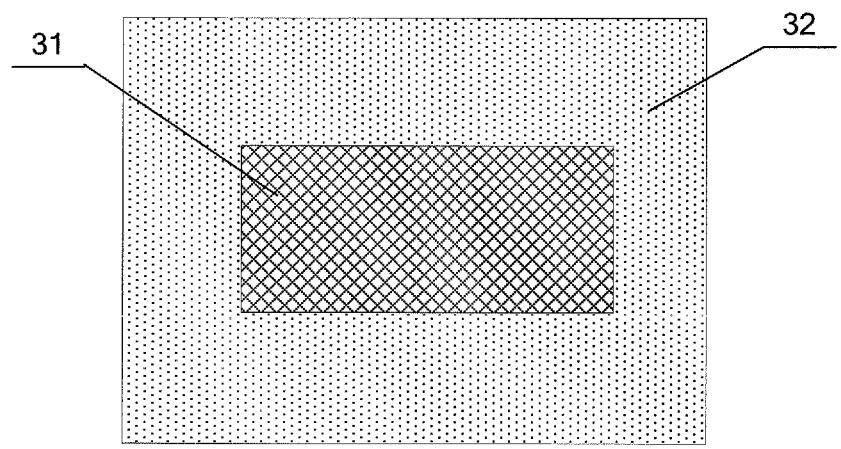
FIG. 8 is a structural schematic view of a detecting mark according to a fifth embodiment of the invention.

In the embodiment, the detecting mark is a reflection type detecting mark. Furthermore, as shown in FIG. 8, the detecting base 32 is a nontransparent window frame with an aperture in the central portion. The detecting pattern 31 is a pattern which is exposed through the aperture of the detecting base 32, and detecting pattern 31 is reflective through the aperture.

The detection on the size of the photoresist pattern for forming the gate line is taken as an example in the embodiment. Since the gate lines are generally formed of a metal material such as AlNd, Al, Cu or the like, the metal material of this type has a relatively higher reflectivity. Comparatively, the reflectivity of the photoresist is much lower. By utilizing this difference in reflectivity, the detection on the size of the photoresist pattern used for forming the gate lines can be realized. First, a layer of gate metal is deposited across the array substrate. Then, by exposing and developing processes, the detecting base 32 is formed from the photoresist in the same layer as the photoresist pattern used to form the gate lines, the detecting base 32 has an aperture in its central portion, and the metal layer below the detecting base is exposed through the aperture. That it to say, the detecting base 32 comprises an aperture, and the aperture exposes the detecting pattern 31 below the detecting base 32. The size of the aperture, i.e., the size of the exposed portion of the detecting pattern 31 is consistent with or complementary to the size of the photoresist pattern used to form the gate lines.

Figure 9:
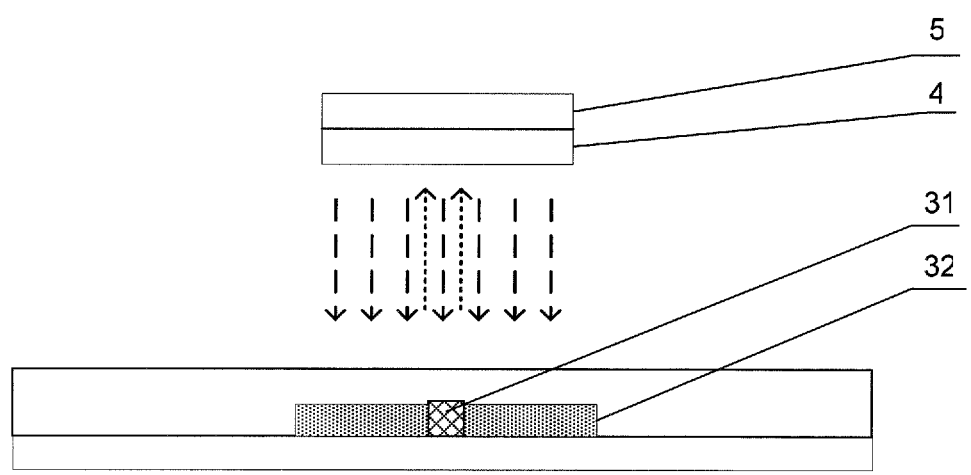
FIG. 9 is a schematic view showing a detecting method according to the fifth embodiment of the invention.

During detecting, as shown in FIG. 9, the detecting mark is irradiated from the front side of the array substrate by direct light emitted from the light emitter 4, and the light reflected from the detecting pattern 31 exposed at the central portion of the detecting base 32 is received by a light receiver 5. The intensity of the reflected light is changed accordingly with the change of the line width. By detecting the intensity of the reflected light, the variation trend of the size of the photoresist pattern used to form the gate lines can be obtained. For example, in the case of complementary size, if the intensity of the reflected light is higher than a standard value, the size of the photoresist pattern used to form the gate lines is more than the predetermined value; if the intensity of the reflected light is lower than the standard value, the size of the photoresist pattern used to form the gate lines is less than the predetermined value. In the example shown in FIG. 9, the non-reflective detecting base 32 defines the detecting area, and the portion of the pattern 31 exposed through the aperture in the detecting base 32 defines the detecting pattern in the detecting area. The light reflectivity of the whole detecting area is influenced directly by the size of the detecting pattern in the detecting area.

Figure 10:
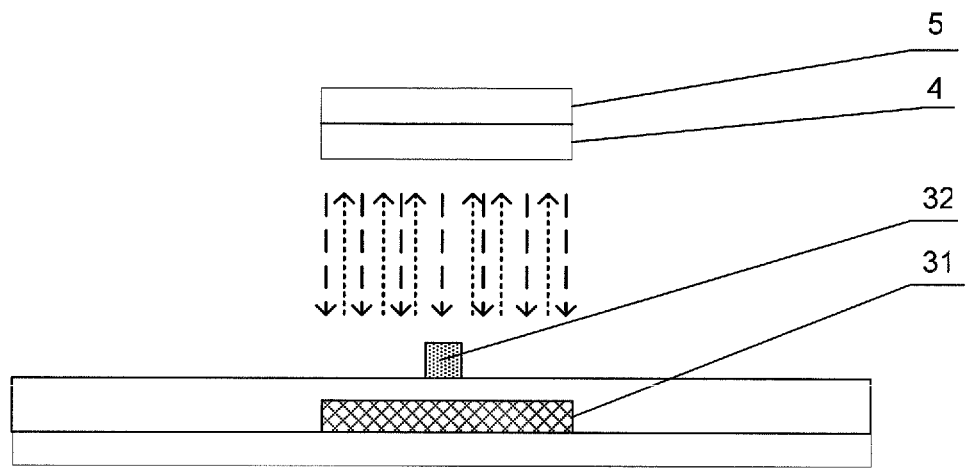
FIG. 10 is another schematic view showing a detecting method according to the fifth embodiment of the invention.

In addition, the embodiment may also provide a reflection type mark, as shown in FIG. 4. The detecting base 32 is reflective, and the detecting pattern 31 does not reflect light. For detecting the size of the photoresist pattern used to form the data lines for an example, the detecting base 32 may be provided in the one of the layers same as the patterns other than the pattern to be detected, or may also be formed by an individual process and provided in a layer different from the layers of the patterns. During detecting, as shown in FIG. 10, the detecting mark is irradiated from the front side of the array substrate with direct light emitted from the light emitter 4, and the light reflected by the detecting base 32 is received by the light receiver 5. The variation of the size of the detecting pattern can be obtained by monitoring the reflectivity, and further the variation of the size of the pattern in the pattern area can be obtained.

The embodiments shown in FIGS. 4 and 8 relates to the processes in which the size of the target array pattern is detected by monitoring the variation of the reflectivity of the detecting area. The array substrate according to the embodiments can be realized as long as the difference between the reflectivity of the detecting pattern and the reflectivity of the remaining area of the detecting area other than the detecting pattern is notable enough that the influence of the size of the detecting pattern on the reflectivity of the whole detecting area can be detected. Therefore, the reflectivity of the detecting pattern may be set larger than that of the remaining area of the detecting area other than the detecting pattern, or the reflectivity of the detecting pattern may be set smaller than that of the remaining area of the detecting area other than the detecting pattern, which depends on the situations in the manufacturing process.

For the TFT-LCD array substrate provided in the embodiment, the detecting mark used to detecting the size of the array pattern in one layer is provided in a region where the multilayer array patterns are not provided. In the manufacturing process, the detecting mark is irradiated with direct light, and the line width of the target array pattern in the layer may be monitored in real time or on-line by detecting the variation in the light reflectivity caused by the detecting pattern which is provided in the same layer and has the same size as the pattern to be detected. The method is easy to be realized and provides much quick and accurate detecting result for the real time size detecting on the array pattern during manufacturing the array substrate and enhances the detecting efficiency and accuracy.

Sixth Embodiment

This embodiment provides an apparatus for detecting the size of an array pattern in one layer among multi-layer patterns during manufacturing a TFT-LCD array substrate. The apparatus comprises a light emitter, a light receiver and a stage for supporting the detected array substrate. A detecting mark is provided in a region of the substrate where the multilayer array patterns are not provided and used to detect the size of the array pattern among the multilayer array patterns. The detecting mark comprises a detecting area and a detecting pattern provided in the same layer and having the same size as the array pattern to be detected. The detecting pattern is located within the detecting area, and the detecting pattern has transmissivity or reflectivity different from that of the remaining area in the detecting area other than the detecting pattern. The light emitter is used to emit light to the detecting mark on the TFT-LCD array substrate, and the light receiver is used to receive the light which is emitted from the light emitter and which passes through or is reflected from the detecting mark.

Furthermore, the apparatus comprises a data processing module electrically connected to the light receiver. The data processing module is used to receive the detecting signal from the light receiver and calculate the light transmissivity or reflectivity.

Furthermore, the light emitter is preferably a laser emitter.

Seventh Embodiment

Figure 11:
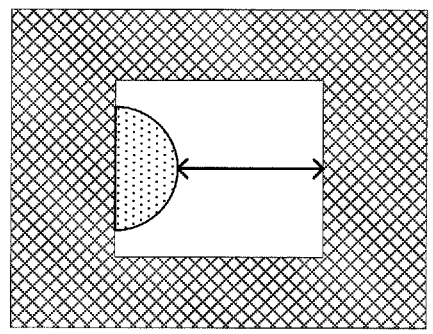
FIG. 11 is a structural schematic view of a detecting mark according to a seventh embodiment of the invention.

In the above embodiments, the size of the array pattern on one layer is detected. In the manufacturing process of the TFT-LCD array substrate, the alignment accuracy is generally required strictly. The alignment deviation may lead to offset of the structures in layers in the pixel region and further cause false of the TFT pixels. Therefore, measuring and monitoring on the alignment deviation of each layer is also required. As the above embodiments, the present embodiment also needs to form a detecting mark. Firstly, a detecting base is formed at a first layer, and the detecting base has a transparent detecting window in its central portion. When a subsequent layer is formed and patterned, a detecting pattern which is non-transparent is designed in a position overlapping the central portion of the window pattern. Therefore, when the first layer and other layers are aligned without deviation, the light passing through the detecting mark is a constant value. When the deviation of the pattern is within an acceptable range, i.e., all the deviations at the upper, bottom, left and right sides are smaller than a standard, then the transmissivity does not change. When the alignment deviation of two layers is beyond the standard, the transmissivity tends to be increased, as shown in FIG. 11. By monitoring the light transmittance, the alignment deviation between different layers can be monitored. For this kind of monitoring, the shapes of the detecting pattern and detecting window will not be limited to the shapes as shown in the FIG. 11 and may also comprise a shape such as rectangular shape, ellipse shape or the like.

For a same layer, the array pattern on the array substrate may be formed by several times of exposing with one mask. Thus, for the process forming a TFT-LCD array substrate, the accuracy control for the several times of exposing processes is also important. Therefore, during the previous exposure with one mask, a detecting window is formed firstly, and then a detecting pattern over the detecting window is formed in the subsequent exposure on the same substrate. Thus, the monitoring on the alignment accuracy between different exposure processes on the same substrate can be further performed.

As described the above and also with reference to FIG. 11, as for the monitoring of the alignment deviation or alignment accuracy, the light transmissivity of a detecting pattern of a certain area that is formed in the detecting window defining the detecting area is set as a standard; when the detecting pattern is offset due to the alignment deviation and only a part of the detecting pattern is formed in the detecting area, the light transmissivity of the detecting area changes as compared with the standard, thus the alignment deviation degree can be determined. Of course, the detecting on alignment deviation is not limited to utilizing the variation in the light transmissivity, and the difference between the reflectivity of the detecting area and the reflectivity of the detecting pattern may be used to perform such a detection.

In addition, for the above designed pattern, the monitoring is performed by forming a detecting pattern over a detecting window. With such a design, the monitoring in the different processes such as exposing, developing, etching, lifting-off can be realized. At the same time, the transparent detecting pattern to be monitored can be formed directly. When the pattern is enlarged, the transmissivity increases accordingly; when the pattern is narrowed down, the transmissivity decreases. Thus, the above monitoring on the size or alignment deviation can be realized. In order to avoid the influence of the stray light in the surrounding region on the detecting result, the non-transparent area may be designed to be large as necessary, then the laser light with excellent directionality is irradiated, and the light receiver is located close to the glass substrate as necessary so as to reduce the background light entering the detecting device.

As for the method for detecting the alignment deviation on the TFT-LCD array substrate in the embodiment, a detecting mark used to detect the alignment deviation of an array pattern on one layer is provided in a region of the substrate where the multilayer patterns are not provided. In the manufacturing process, by irradiating the detecting mark with direct light, the alignment deviation of the array pattern on the layer can be monitored in real time or on-line by detecting the variation in the light transmissivity or reflectivity. The array substrate can be manufactured simply and easy to be realized, which enhances the alignment efficiency or accuracy.

Those skilled in the art may understand that the units or calculation steps in the examples described in the embodiments can be realized by hardware, firmware, software or any combination thereof. In order to describe the exchangeability among hardware, firmware, and software, the steps in each example are described in a general way based on the functionalities. Whether these functions are performed by a hardware or a software is determined as necessary. Those skilled in the art may realize the described functions by using different means, but the implementation should be within the scope of the invention.

The method or calculation steps described in the embodiments can be performed by hardware, firmware, software module performed by a processor, or any combination thereof. The software module may be stored in a storage media such as random access memory (RAM), internal storage, read only memory (ROM), electrically programmable ROM (EPROM), electrically erasable and programmable ROM (EEPROM), register, hard disk, removable disk, CD-ROM, or any other forms commonly known in the field.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A thin film transistor liquid crystal display (TFT-LCD) array substrate comprising
    a substrate;
    multilayer array patterns formed on the substrate, and
    a detecting mark, which is used to detect the size or alignment deviation of one array pattern among the multilayer array patterns and provided in a region of the substrate where the multilayer array patterns are not provided,
    wherein the detecting mark comprises a detecting area and a detecting pattern which is provided in the same layer as the array pattern to be detected, the detecting pattern is located within the detecting area, and the detecting pattern has transmissivity or reflectivity different from that of the remaining area in the detecting area other than the detecting pattern,
    wherein the detecting pattern and the array pattern to be detected are formed simultaneously in a same process,
    wherein the detecting mark is used to detect the size of the array pattern to be detected, the detecting pattern within the detecting area has the same size as that of the array pattern to be detected, and the size of the detecting pattern is obtained by detecting the variation in the transmissivity or the reflectivity of the detecting area compared with a predetermined value, whereby the size of the array pattern to be detected is also obtained.

2. The TFT-LCD array substrate of claim 1, wherein the detecting mark is used to detect the alignment deviation of the pattern to be detected, and the alignment deviation of the array pattern to be detected is obtained by detecting the variation in the transmissivity or the reflectivity of the detecting area compared with a predetermined value.

3. The TFT-LCD array substrate of claim 1, wherein the detecting area is a transparent area, and the detecting pattern is nontransparent.

4. The TFT-LCD array substrate of claim 3, wherein the detecting area is a transparent area which is surrounded by a nontransparent window frame.

5. The TFT-LCD array substrate of claim 1, wherein the reflectivity of the detecting pattern is larger than that of the remaining area of the detecting area other than the detecting pattern.

6. The TFT-LCD array substrate of claim 5, wherein the remaining area in the detecting area other than the detecting pattern is a photoresist pattern with an aperture, and the detecting pattern is a metal pattern which is under the photoresist pattern and exposed through the aperture of the photoresist pattern.

7. The TFT-LCD array substrate of claim 1, wherein the reflectivity of the detecting pattern is smaller than that of the remaining area in the detecting area other than the detecting pattern.

8. The TFT-LCD array substrate of claim 7, wherein the detecting area comprises a metal layer, and the detecting pattern is formed of a photoresist pattern on the metal layer.

9. The TFT-LCD array substrate of claim 2, wherein the detecting area is a transparent window surrounded by a nontransparent pattern, and at least a part of a nontransparent pattern with a certain area is formed within the detecting area so as to form the detecting pattern.

10. A method for detecting size or alignment deviation of an array pattern or photoresist pattern during manufacturing a thin film transistor liquid crystal display (TFT-LCD) array substrate, comprising:
providing a detecting mark in a region of the array substrate where no multilayer array patterns are provided, wherein the detecting mark is used to detect the size or the alignment deviation of the array pattern among the multilayer array patterns or the photoresist pattern, the detecting mark comprises a detecting area and a detecting pattern which is provided in the same layer as the array pattern to be detected, the detecting pattern is located within the detecting area, and the detecting pattern has transmissivity different from that of the remaining area in the detecting area other than the detecting pattern;
irradiating the detecting mark from the backside of the substrate with direct light;
receiving the light passing through the detecting mark;
calculating the light transmissivity, and if the light transmissivity of the light is not consistent with a standard transmissivity, then the array pattern to be detected is determined as unqualified, otherwise the array pattern to be detected is determined to be qualified;
or,
wherein the detecting pattern has reflectivity different from that of the remaining area in the detecting area other than the detecting pattern, and irradiating the detecting mark from the front side of the substrate with direct light;
receiving the light reflected back by the detecting mark;
calculating the light reflectivity, and if the light reflectivity is not consistent with a standard reflectivity, then the pattern to be detected is determined as unqualified, otherwise the pattern to be detected is determined to be qualified,
wherein the detecting pattern and the array pattern to be detected are formed simultaneously in a same process,
wherein the detecting mark is used to detect the size of the array pattern to be detected, the detecting pattern within the detecting area has the same size as that of the array pattern to be detected, and the size of the detecting pattern is obtained by detecting the variation in the transmissivity or the reflectivity of the detecting area compared with a predetermined value, whereby the size of the pattern to be detected is also obtained.

11. The method of claim 10, wherein the detecting mark is used to detect the alignment deviation of the array pattern to be detected, and the alignment deviation of the detecting pattern to be detected is obtained by detecting the variation in the transmissivity or the reflectivity of the detecting area compared with a predetermined value.

12. The method of claim 10, wherein the detecting area is a transparent area which is surrounded by a nontransparent window frame, and the detecting pattern is nontransparent.

13. The method of claim 10, wherein the reflectivity of the detecting pattern is larger than that of the remaining area in the detecting area other than the detecting pattern.

14. The method of claim 13, wherein the remaining area in the detecting area other than the detecting pattern is a photoresist pattern with an aperture, and the detecting pattern is a metal pattern which is under the photoresist pattern and exposed through the aperture of the photoresist pattern.

15. The method of claim 10, wherein the reflectivity of the detecting pattern is smaller than that of the remaining area in the detecting area other than the detecting pattern.

16. An apparatus for performing the method of claim 10, comprising:
a light emitter and a light receiver
wherein a detecting mark, which is used to detect size or alignment deviation of one array pattern among multilayer array patterns, is provided in a region of an array substrate where the multilayer array patterns are not provided, the detecting mark comprises a detecting area and a detecting pattern which is provided in the same layer as the array pattern to be detected, the detecting pattern is located within the detecting area, the detecting pattern has transmissivity or reflectivity different from that of the remaining area in the detecting area other than the detecting pattern; and
wherein the light emitter is used to emit light to the detecting mark on the array substrate, and the light receiver is used to receive the light emitted from the light emitter and which passes through the detecting mark or is reflected back from the detecting mark,
wherein the detecting pattern and the array pattern to be detected are formed simultaneously in a same process,
wherein the detecting mark is used to detect the size of the array pattern to be detected, the detecting pattern within the detecting area has the same size as that of the array pattern to be detected, and the size of the detecting pattern is obtained by detecting the variation in the transmissivity or the reflectivity of the detecting area compared with a predetermined value, whereby the size of the pattern to be detected is also obtained.

17. The apparatus of claim 16, further comprising a data processing module electrically connected to the light receiver.

18. The apparatus of claim 16, wherein the light emitter is a laser emitter.

* * * * *